US007908579B2

United States Patent
Irmatov et al.

(10) Patent No.: US 7,908,579 B2
(45) Date of Patent: Mar. 15, 2011

(54) METHOD AND MECHANISM FOR EXTRACTION AND RECOGNITION OF POLYGONS IN AN IC DESIGN

(75) Inventors: Anwar Irmatov, Moscow (RU); Alexander Belousov, Moscow region (RU); Eitan Cadouri, Cupertino, CA (US); Andrei Gratchev, Moscow (RU); Alexander Ryjov, Moscow (RU); Laurent Thenie, Peynier (FR)

(73) Assignee: Cadence Design Systems, Inc., San Jose, CA (US)

( * ) Notice: Subject to any disclaimer, the term of this patent is extended or adjusted under 35 U.S.C. 154(b) by 366 days.

(21) Appl. No.: 11/624,176

(22) Filed: Jan. 17, 2007

(65) Prior Publication Data

US 2007/0288876 A1    Dec. 13, 2007

(51) Int. Cl.
G06F 17/50    (2006.01)
(52) U.S. Cl. ........................................ 716/125; 716/124
(58) Field of Classification Search .................. 716/2, 7, 716/19–21, 5
See application file for complete search history.

(56) References Cited

U.S. PATENT DOCUMENTS

| 5,771,045 A * | 6/1998 | Ghavam et al. ............... 345/423 |
| 7,246,343 B2 * | 7/2007 | Joshi et al. ........................ 716/19 |
| 2006/0048091 A1 | 3/2006 | Joshi et al. |
| 2006/0236299 A1 * | 10/2006 | Sahouria et al. ............... 716/21 |

FOREIGN PATENT DOCUMENTS

JP    3176784 A    7/1991
WO    2005058029 A2    6/2005

OTHER PUBLICATIONS

Sato, M. et al. "A Theoretically Optimal and Practically Fast Algorithm for VLSI Geometric Design Rule Verification" IEEE International Symposium on Circuits and Systems (ISCAS '88), Jun. 7-9, 1988, vol. 2, pp. 1445-1448.
English translation of abstract for JP 3176784 published on Jul. 31, 1991.

* cited by examiner

*Primary Examiner* — Vuthe Siek
(74) *Attorney, Agent, or Firm* — Vista IP Law Group LLP

(57) ABSTRACT

Disclosed is an improved approach for organizing, analyzing, and operating upon polygon data which significantly reduces the amount of data required for processing while keeping elements non-interfacing with each other. According to one approach, clusters of elements are extracted which are then handled separately. In some approaches, a set of polygons forms a cluster if for any two polygons from the set of polygons there exists a sequence of polygons from the set such that the distance between any sequential polygons are less than or equal to a given threshold number. Rather than analyzing each and every polygon in the design, repetitive unique patterns are analyzed once, which are then replicated for all clusters which have the same repetitive pattern.

35 Claims, 9 Drawing Sheets

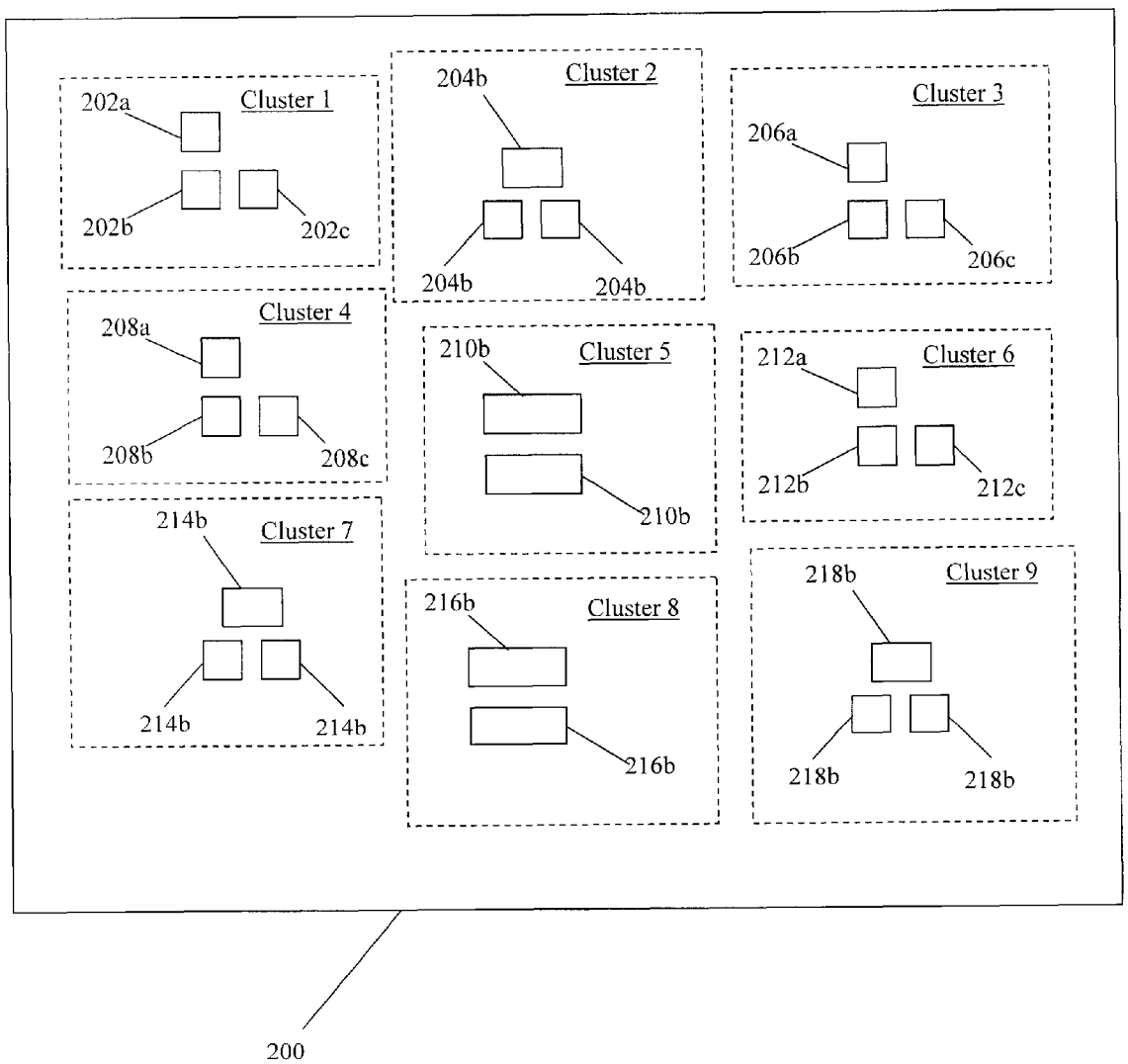
Fig. 2B - Clustering

Fig. 2C - Pattern Recognition
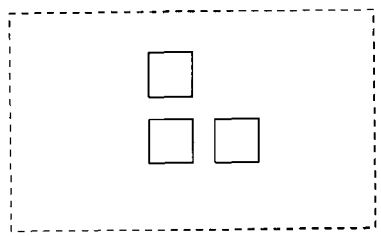
Pattern A : Cluster 1, Cluster 3, Cluster 4, Cluster 6
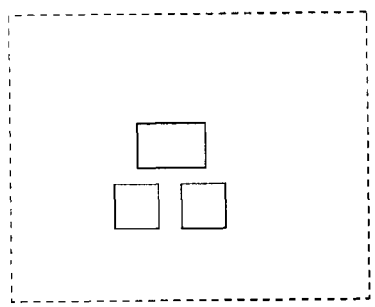
Pattern B : Cluster 2, Cluster 7, Cluster 9
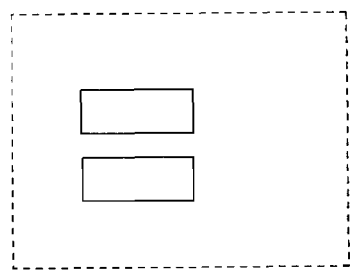
Pattern C : Cluster 5, Cluster 8

Fig. 2D - Analyze/Operate on Unique Patterns
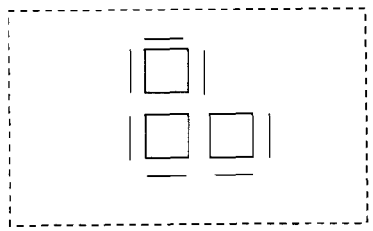
Pattern A : Scattering bars added next to polygons
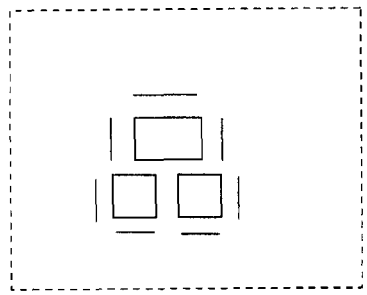
Pattern B : Scattering bars added next to polygons
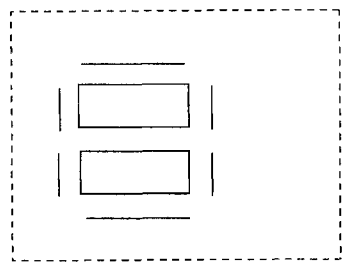
Pattern C : Scattering bars added next to polygons

Fig. 2E - Apply to all Clusters
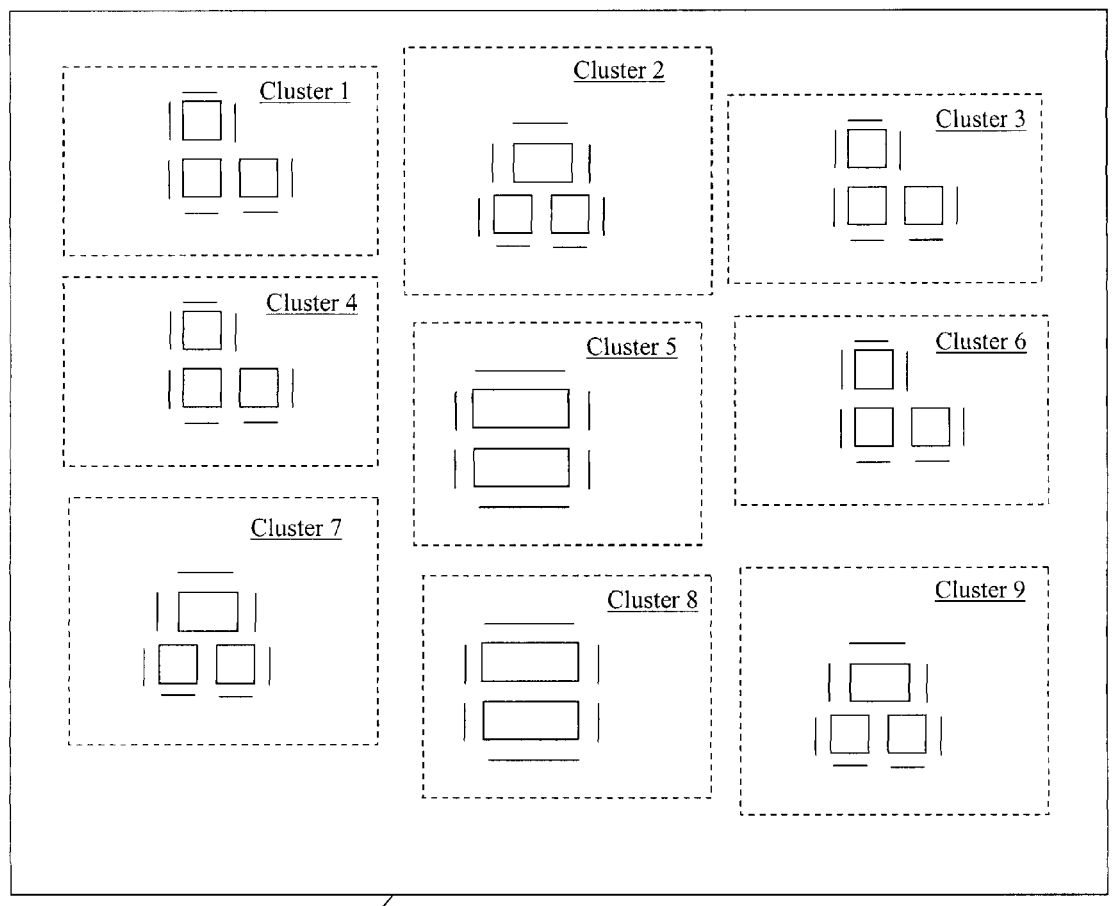

METHOD AND MECHANISM FOR EXTRACTION AND RECOGNITION OF POLYGONS IN AN IC DESIGN

RELATED APPLICATION DATA

This application claims priority to Russian Application No. 2006120375 filed on Jun. 9, 2006, the entire disclosure of which is incorporated herein by reference.

BACKGROUND AND SUMMARY

The invention relates to technology for implementing electronic design automation tools, and in particular embodiments, for performing extraction and recognition of polygons for electronic design automation tools that operate upon an integrated circuit ("IC") design.

An IC is a small electronic device typically formed from semiconductor material. Each IC contains a large number of electronic components, e.g., transistors, that are wired together to create a self-contained circuit device. The components and wiring on the IC are materialized as a set of geometric shapes or polygons that are placed and routed on the chip material. During placement, the location and positioning of each geometric shape corresponding to an IC component are identified on the IC layers. During routing, a set of routes are identified to tie together the geometric shapes for the electronic components.

Once the layout is finished, it is verified to make sure it satisfies the design rules, which are typically provided by the foundry that is to manufacture the IC device. This verification process is called Design Rule Check (DRC). The design rules are a set of rules regarding minimum distances, sizes, enclosure criteria, among other constraints for implementing the layout. The rules have to be observed in order to maximize chances of a successful fabrication of the integrated circuit.

Numerous other types of operations and analysis may also be performed upon the set of polygons that form the IC design. For example, the polygons may be analyzed to determine whether optical proximity correction ("OPC") should be applied to the polygons. OPC refers to the process of adding additional polygons to the IC mask design to correct for any anticipated optical effects that may exist to cause errors or inaccuracies in the shapes of components of the final integrated circuit product that are caused by the lithographic process of forming the integrated circuit. A common example of an OPC operation is to analyze the IC design to determine whether there exists polygons having a segment or wall that is not near enough another polygon, which could result as a curved segment in the final IC product due to optical effects of the lithographic process. To correct for this type of optical effect, a scattering bar, below the resolution limit of the lithography equipment, is added parallel to the segment of interest. This scattering bar will cause the lithography equipment to produce a straighter segment or wall for the polygon.

Given the large numbers of components in a typical IC design, it often takes a long period of time and a significant amount of system resources (both for CPU and memory) to perform a set of operations or analysis upon a given IC design. In particular, consider an IC design having many millions of polygons. Each of the polygons potentially need to be analyzed and operated upon to determine, for example, the applicability of scattering bars. As another example, each of the millions of polygons need to be checked to determine and identify any violations of DRC rules.

As the complexity and size of layout data grow dramatically for new generation of Integrated Circuits (IC), existing methods to organize the IC data become ever more inadequate to allow efficient access and analysis of the data.

Therefore, to address this and other problems with the prior solutions, embodiments of the present invention provide an improved approach for organizing, analyzing, and operating upon polygon data which significantly reduces the amount of data required for processing while keeping elements non-interfacing with each other. According to one embodiment, clusters of elements are extracted which are then handled separately. In some embodiments, a set of polygons forms a cluster if for any two polygons from the set of polygons there exists a sequence of polygons from the set such that the distance between any sequential polygons are less than or equal to a given threshold number. Rather than analyzing each and every polygon in the design, repetitive unique patterns are analyzed once, which are then replicated for all clusters which have the same repetitive pattern. Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF DRAWINGS

FIGS. 2A-E provides an illustrative example for extraction and recognition of polygons in an integrated circuit design according to some embodiments of the invention.

DETAILED DESCRIPTION

Embodiments of the present invention provide an improved approach for organizing, analyzing, and operating upon polygon data which significantly reduces the amount of data required for processing while keeping elements non-interfacing with each other. Embodiments of the invention provide an improved approach to layout data restructuring and hierarchy creation for better and more efficient processing. An automated method to form clusters from polygons and a method to code a set of polygons in a given layout in terms of tree structure is disclosed. The automated method for forming clusters from polygons provides selection subsets of shapes which do not affect other shapes and also provides coding for a set of polygons in a given layout in terms of tree structure to allow recognition of repeated patterns in a layout data. The result includes sets of shapes ("clusters") selected from layout that are repeated a number of times but not affecting each other during the future processing. The output sets of shapes can be processed independently. As the total number of shapes is decreased due to pattern repetition, further processing consumes less resources comparing to the original approaches.

The approach of some embodiments of the present invention sweeps the whole data one time and runs in $O(n \log n)$ time and utilizes $O(n^{0.5})$ main memory. It recognizes all clusters in a given layer and forms the list of all classes of equivalent clusters existing in the layer. For any given cluster in the layer it finds the class of equivalence containing it from the list of classes of equivalent clusters.

Figure 1:
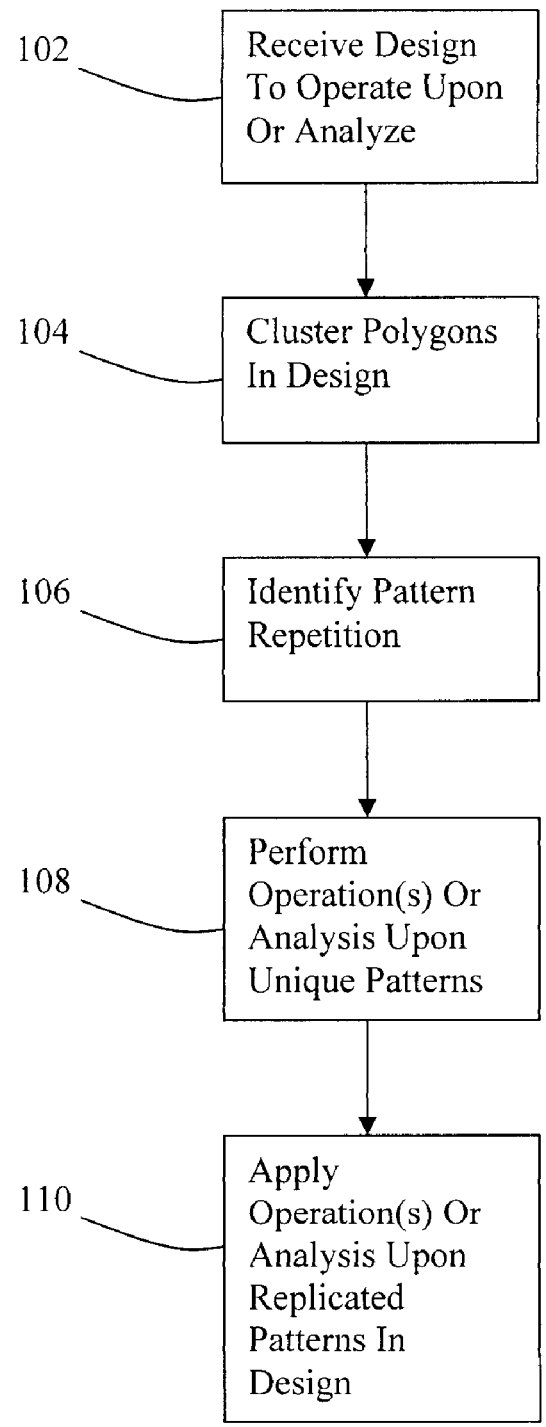
FIG. 1 illustrates a flowchart of a process for extraction and recognition of polygons in an integrated circuit design according to some embodiments of the invention.

FIG. 1 shows a flowchart of a process for extraction and recognition of polygons according to an embodiment of the invention. At 102, the process receives an IC design to be analyzed or operated upon. The IC design comprises a physical design materialized as a set of geometric shapes or polygons.

At 104, clusters of elements are extracted which are then handled separately. In some embodiments, a set of polygons forms a cluster if for any two polygons from the set of polygons there exists a sequence of polygons from the set such that the distance between any sequential polygons are less than or equal to a given threshold number.

Repetitive patterns are identified within the different clusters (106). Rather than analyzing each and every polygon in the design, repetitive unique patterns are analyzed once (108) which are then replicated for all clusters which have the same repetitive pattern (110).

Figure 2A:
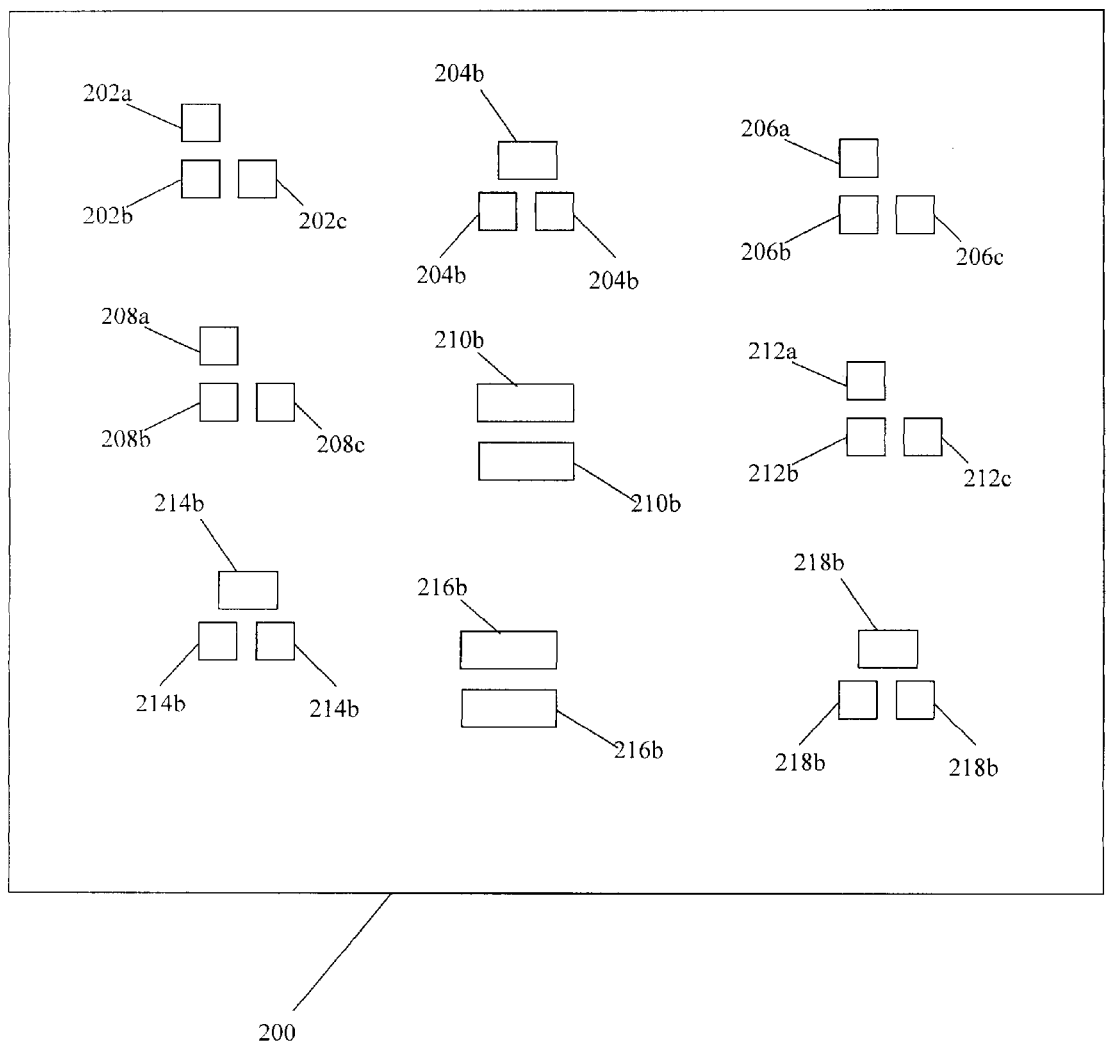

To illustrate this process, consider the example set 200 of polygons shown in FIG. 2A. This set 200 of polygons includes 31 different polygons 202a-c, 204a-c, 206a-c, 208a-c, 210a-b, 212a-c, 214a-c, 216a-b, and 218a-c. Assume that it is desired to perform some sort of electronic design automation (EDA) analysis or operation upon this set 200 of 31 polygons. For example, assume that it is desired to perform OPC processing to determine whether and how scattering bars should be added to the IC design. With conventional processing, each polygon in the set 200 must be individually considered and processed to identify scattering bars that should be added to the design.

In this example of just 31 polygons in FIG. 2A, it will not require excessive computing resources to perform this type of analysis against each polygon. However, in typical IC designs, this number is multiplied many times over since there may very well exist an extremely large number of polygons in the design, e.g., having many millions of polygons. If there are many millions of polygons, and if each and every polygon needs to be individually processed, then a truly enormous amount of time and computing resources will likely be needed to handle the required processing. This exemplifies the type of problems that is faced by many EDA tools, since each one of those millions of polygons may need to be addressed to perform the required analysis or operation using conventional EDA tools.

Embodiments of the present invention will instead perform clustering to avoid many of these problems of the prior art. As noted above, a set of polygons forms a cluster if for any two polygons from the set of polygons there exists a sequence of polygons from the set such that the distance between any sequential polygons are less than or equal to a given threshold number. For the example set 200 of polygons shown in FIG. 2A, a set of nine clusters can be formed as shown in FIG. 2B. In particular, polygons 202a, 202b, and 202c are collected as cluster 1. Similarly, polygons 204a-c forms cluster 2, polygons 206a-c forms cluster 3, polygons 208a-c forms cluster 4, polygons 210a-b forms cluster 5, polygons 212a-c forms cluster 6, polygons 214a-c forms cluster 7, polygons 216a-b forms cluster 8, and polygons 218a-c forms cluster 9.

The next action is to perform pattern recognition to identify the set of unique patterns that exist in the IC design. In typical IC designs, the same patterns will be repeated many times within the design. By recognizing specific unique patterns, this allows the EDA tool to only perform processing once for each unique pattern, while replicating the results of that processing or analysis for each of the repetitive instance of those patterns within the design. For example, while there may exist many millions of different polygons in an IC design, those millions of polygons may only form several thousands of unique patterns. Instead of performing millions of separate processing actions for each polygons, only the several thousand unique patters needs to be individually processed according to embodiments of the invention.

Referring to FIG. 2C, the clusters 1-9 formed from the example set 200 of polygons has been analyzed and it has been determined that there are only three unique patterns within those clusters. In particular, Pattern A is an unique arrangement of three polygons that is common between clusters 1, 3, 4, and 6. Pattern B is an unique arrangement of three polygons that is common between clusters 2, 7, and 9. Pattern C is an unique arrangement of two polygons that is common between clusters 5 and 8.

Each of the unique patterns is operated upon to perform the desired processing and/or analysis. For example, assume that it is desired to perform OPC processing to add scattering bars to the design. FIG. 2D shows example results of adding scattering bars to Pattern A, Pattern B, and Pattern C.

Referring to FIG. 2E, the next action is to replicate the processing results to each repetitive instantiation of the unique pattern within the clusters. Here, Pattern A exists within clusters 1, 3, 4, and 6. Therefore, the scattering bar combination established for Pattern A shown in FIG. 2D is repeated for clusters 1, 3, 4, and 6. Pattern B exists within clusters 2, 7, and 9. Therefore, the scattering bar combination established for Pattern B is repeated for clusters 2, 7, and 9. Pattern C exists within clusters 5 and 8. In like manner to the other patterns, the scattering bar combination established for Pattern C is repeated for clusters 5 and 8.

This result highlights the advantage of the present approach. Instead of individually processing each polygon within the design, or even individually processing each cluster, only the unique patterns have been processed. The repetitive usage of those patterns allow the unique pattern to be analyzed/processed once, but the results of that analysis or processing is repeated for each repetitive instantiation of that pattern.

At this point, it is useful to provide a more detailed description of some embodiments of the invention. Assume that there is a given number d and a layer comprising a number polygons of arbitrary shape. The present embodiment refers to a set of polygons as forming a d-cluster if for any two polygons from the set there exists a sequence of polygons from the set such that the distance between any sequential polygons is less than or equal to a given threshold number d. Two clusters are equivalent if there exists an orthogonal transformation that establishes one-to-one correspondence between polygons from the two clusters. Embodiments of the invention provide a method of extracting all d-clusters and coding d-cluster which allows formation of a list of representatives for all classes of equivalent d-clusters presented in a given layer. The method also provides that for any extracted d-cluster to define its type of equivalence from constructed list. The approach solves the above described problems in O(n log n) time and using $O(n^{0.5})$ main memory.

Figure 3:
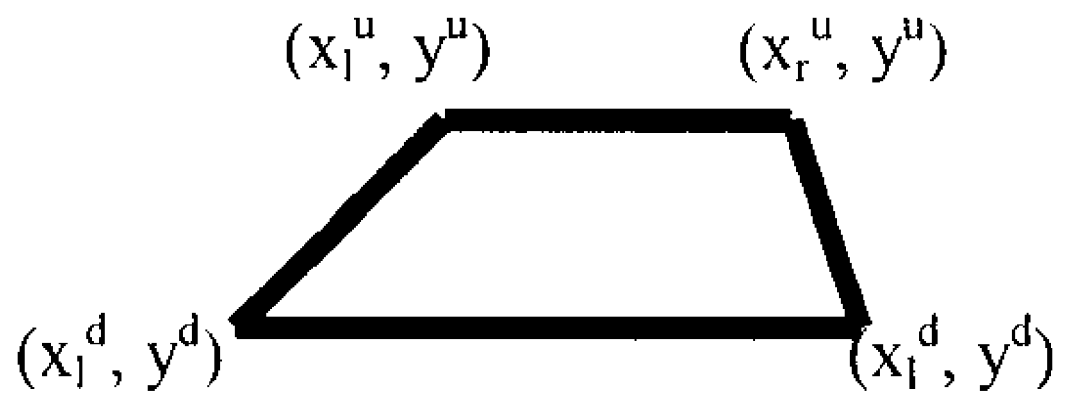
FIG. 3 shows an example trapezoid with which embodiments of the invention are implemented.

The input of the present method is the trapezoidation of a given layer. Referring to FIG. 3, assume that the a polygon is a trapezoid with arbitrary slope of the lateral edges defined by its four vertices with coordinates $(x_1^d, y^d)$, $(x_1^u, y^u)$, $(x_r^u, y^u)$, $(x_1^d, y^d)$.

Let $A=(x_1, y_1)$, $B=(x_2, y_2)$ be two vertices. The method according to the present embodiment introduces an order ORD in the set of all trapezoids vertices by the following rule:

vertex $A<_{ORD}$ a vertex B iff 1) $y_1<y_2$ or 2) $y_1=y_2$ and $x_1<x_2$.

This approach uses the notation SW→$(x_1^d, y^d)$, NW→$(x_1^u, y^u)$, NE→$(x_r^u, y^u)$, SE→$(x_1^d, y^d)$.

According to some embodiment, the "plane-sweep" method is employed to extract and form clusters. The process of forming a cluster starts from sorting all vertices of input trapezoids in the increasing ORD order and storing them in a sequential file, referred to herein as FILE. At the beginning, the process considers each trapezoid as the head of the list which corresponds to a cluster of type 1. The process accounts for all trapezoids to be numerated according the increasing ORD order of their SW corners. Further, a cluster of type k will mean that the cluster contains k trapezoids and all trapezoids which are included in the list is characterized as a cluster have pointers to the lists head. Then the process will start to pop vertices from queue FILE and check if there exist already considered trapezoids in d-neighborhood of the current vertex and detect all trapezoids which satisfy the condition.

Let h be a lower boundary edge of a trapezoid A considering by the method at the current moment. Since each detected trapezoid has a pointer to the head of the cluster containing it, the process can associate with each detected trapezoid, from the left (SW corner) and the right (SE corner) endpoint of h, the sequential number of cluster containing it. The process then chooses the minimum from these numbers and attaches the number to the trapezoid A. Then, the process places the trapezoid A into the head of the list (indeed the root of a tree) with pointers to the heads $B_i$ of lists (subclusters), containing the detected trapezoids, and form vectors (SW(A), SW($B_i$)). Also, the head of the new list will contain the type of the cluster—the number of trapezoids in the cluster. It follows from the process of cluster forming the method of it coding.

The process will represent a cluster as a tree. Each node u of the tree corresponds to a trapezoid A(u) of the cluster. Due to the process of forming a cluster, a son of a node of the tree corresponds to the head (the root of a subtree) of a subcluster formed on previous steps, and each node contains the pointer to the head of the cluster. The process codes each node u of the tree in the following way:

full code $(1, (p_1, (x_1, y_1), t_1), \ldots, (p_1, (x_1, y_1), t_l))$ and
short code $(1, (p_1, f(x_1, y_1)), \ldots, (p_1, f(x_1, y_1)))$ where l is the number of sons of the node v, $p_i$ is a pointer to the head of the cluster containing the i-th detected trapezoid, $(x_i, y_i)$ is the vector SWA(u)-SWA(son u) following in the increasing order of the numbers corresponding to detected clusters, $t_i$ is a type of trapezoid (coordinates of its vertices), and function f is specially chosen for enhancing speed of recognizing clusters.

When the difference between the y-coordinate of currently considered vertex and y-coordinate of the upper edge of the trapezoid which currently is the head of a cluster is more than d, the process of forming that cluster is stopped. At this moment the process checks if the just formed cluster belongs to already found classes of equivalent d-clusters presented in a given layer. First, the process compares a short code of the formed cluster with short codes of representatives of classes of equivalent d-clusters storing in a special file, and if short codes coincide then it compares their full codes.

At the end of the procedure the process obtains the list of representatives for all classes of equivalent d-clusters presented in a given layer; any trapezoid is included in the list of trapezoids describing containing it cluster and any such list has identification with containing it class of equivalence.

According to one embodiment, the plane-sweep method can search in only horizontal or vertical direction, since it stores only objects intersecting the horizontal or vertical scan-line in a temporary memory (work-list). To execute the both search simultaneously, two work-lists are employed, referred to as the Current Scan-Line (CSL) and Previous Boundary (PB).

The CSL is a work list which is managed by means of a balanced tree data structure. Each node of the data tree contains as a key the line passing through the side edge incidental to a south vertex of a trapezoid.

The PB stores a set of line segments of trapezoids boundaries which are vertically visible from the scan-line. The PB is managed by means of a balanced tree data structure in the increasing x-coordinate order and leafs points to corresponding upper horizontal or lateral segments of trapezoid or to the NILL.

Each search and update operation (insertion or deletion) is done in O(log k) time, where k is the number of line segments in CSL and PB. The scanned vertices are stored in a queue Q. The queue Q maintains just those segments in the list PB which lie in d-strip under current scan line. When CSL change its position, i.e. y-coordinate, then a check is made of the inequality $y_{curr.vertex} - y_u > d$ for each vertex u from Q, and delete a segment h from PB if the inequality holds for each boundary vertices of the segment.

In one embodiment, the value of distance d is modifiable to optimize the process of clustering. The reasons for this is that if the value of distance d is either too large or too small, then the process may form an inefficient number of clusters and/or an inefficient number of polygons associated with each cluster. For example, consider if the value of distance d is overly large. In this case, it is likely that there will be a very small number of clusters, with each cluster potentially having a very large number of polygons. In the extreme example, if the value of d is equivalent to the size of the entire IC, then the process will only form a single cluster associated with all of the polygons on the IC. On the other hand, if the value of distance d is too small, then there may potentially be a overly large number of clusters, with each cluster having very few polygons.

To address this issue, the process can be configured to iterate with different values for distance d. One or more thresholds can be configured to identify a point at which an acceptable result is identified and the iterations can end. In one embodiment, the thresholds correspond to (1) an acceptable or maximum number of polygons in a cluster; and/or (2) an acceptable value for d.

For example, the process can begin with a relatively large value of d. With a large value for d, it is likely that there will be a relatively small number of clusters with each cluster having a large number of polygons. This result is compared against the established threshold value(s). If the number of polygons in the cluster(s) exceeds the threshold, then the value d is decreased and the process iterates again. The resulting polygons per cluster result is compared again with the threshold to determine if the process should end. If the results exceeds the threshold, then the iterations repeat until the acceptable result has been attained. One way to decrease the value d in an embodiment is to divide d by an established or calculated factor, e.g., divide by a factor of 2.

The threshold value for distance d can be implemented according to any desired parameter. For example, the threshold value for d can be based upon the minimum spacing distance rule between objects in the design, e.g., by establishing the threshold value of d to be either 3 times or 4 times the value of the minimum spacing rule between geometries.

Figure 4:
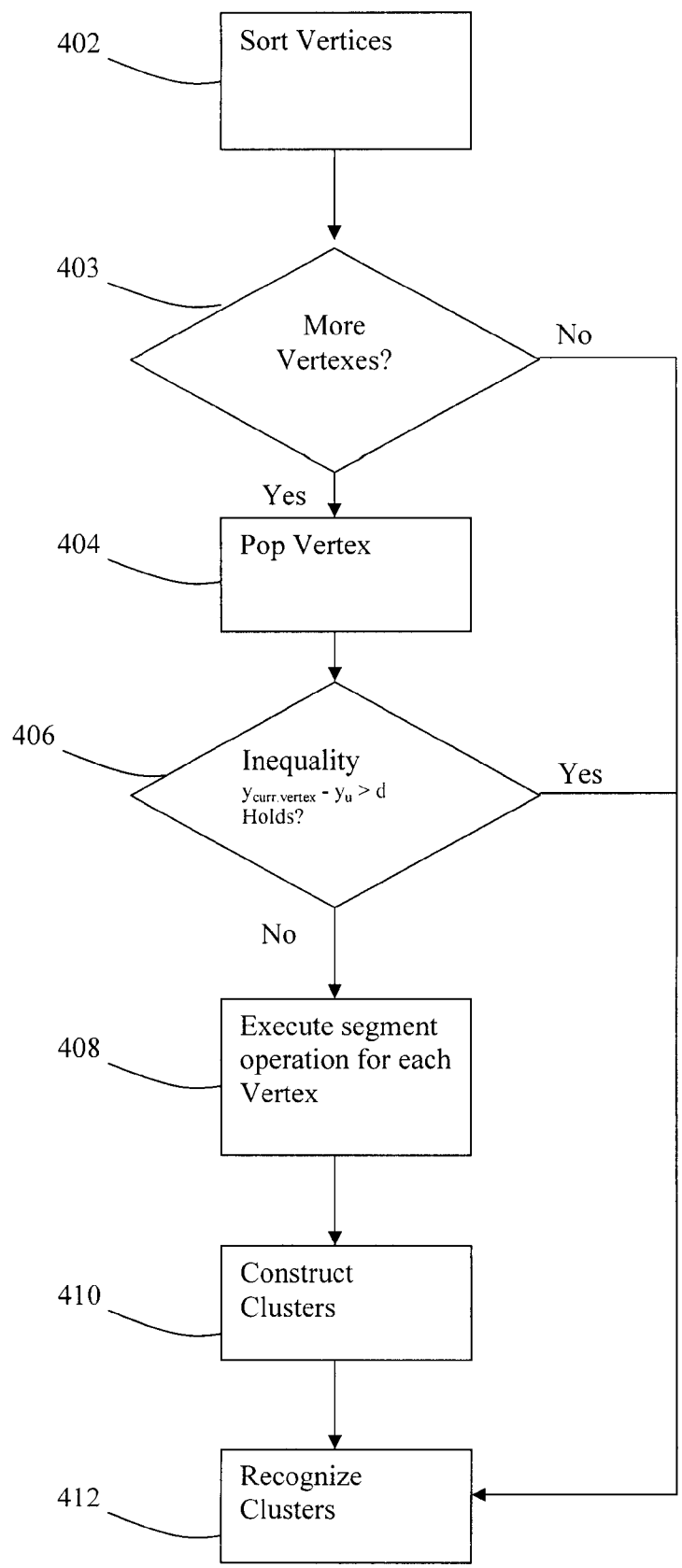
FIG. 4 illustrates a flowchart of a process for clustering polygons according to some embodiments of the invention.

Referring to FIG. 4, a more detailed description will now be provided of a method for recognizing clusters of polygons.

At 402, the method sorts all vertices of input trapezoids in the increasing ORD order and store them in a sequential file FILE. Each vertex caries information of the trapezoid containing it. The method will numerate all trapezoids in the increasing ORD order following the rule that trapezoid A<trapezoid B iff SW(A)<SW(B).

At the beginning, the process considers each via as the head of the list which corresponds to a cluster of type 1 (containing one via; further cluster of type k will mean that the cluster contains k vias).

At 403, a determination is made whether there exists any more vertexes in FILE. If there exists more vertexes in FILE, then at 404 the method pops a vertex v from FILE. If there are no more vertexes in FILE, then the method proceeds directly to action 412.

At 406, a determination is made regarding the inequality:

$$y_{curr.vertex} - y_u > d(*).$$

If v is the first point in the current scan line (y-coordinate of v>y-coordinate of previous point) then check for each vertex u from Q the above inequality. If the inequality (*) holds for each boundary vertices of a segment from PB, then the method deletes the segment from PB and both boundary vertices of the segment from the Q. If the vertex u is NE or NW-type, and for y-coordinate of the upper boundary edge of the trapezoid, which is the head of a cluster containing the current vertex u, the inequality (*) holds also, then delete u from Q and the method proceeds directly to action 412.

At 408, for each vertex v, the method executes one of the following operations (4.1)-(4.4).

(4.1): Execute when v is SW or SE corner: Insert a lateral edge with v into CSL. Detect (if distance is less or equal to d) the closest edge from the left of v if v is SW corner and from the right of v if v is the SE corner by searching CSL. For each south horizontal edge of the executing trapezoid check the distance between the horizontal edge and all vertices from PB lying under the edge. Also check the distance between the boundary vertices of the horizontal edge and all segments from PB incidental to vertices lying under the edge. Detect (if distance is less or equal to d) the segments from PB which are close to the horizontal edge containing v. Insert both boundary vertices of the horizontal edge into PB and delete all vertices from PB lying between them.

(4.2): Execute if v is an SW corner, then for each segment f from the work-list PB which has at least one end u such that x-coordinate of $v$–x-coordinate of $u <= d$ Check if Euclidean distance between v and segment f is less or equal to d. Detect it if the distance<=d.

If v is an SE corner, then for each segment from the work-list PB which has at least one end u such that x-coordinate of $u$–x-coordinate of $v <= d$ Check if Euclidean distance between v and segment f is less or equal to d. Detect it if the distance<=d.

(4.3) Execute if v is NW or NE corner: Detect (if distance is less or equal to d) the closest edge from the left of v if v is NW corner and from the right of v if v is the NE corner by searching CSL. Delete the lateral edge with v from CSL. Insert v into PB. If angle with vertex v is acute then check the distance between the lateral edge incidental to v and all vertices from PB lying under the edge. Also check the distance between the boundary vertices of the lateral edge and all segments from PB incidental to vertices lying under the edge. Detect (if distance is less or equal to d) the segments from PB which are close to the lateral edge containing v. Delete all vertices from PB lying under the lateral edge containing v.

(4.4) Execute if v is an NW corner: For each segment f from the work-list PB which has at least one end u such that x-coordinate of $v$–x-coordinate of $u <= d$ check if Euclidean distance between v and segment f is less or equal to d. Detect it if the distance<=d.

Execute if v is an NE corner: For each segment f from the work-list PB which has at least one end u such that x-coordinate of $u$–x-coordinate of $v <= d$ Check if Euclidean distance between v and segment f is less or equal to d. Detect it if the distance<=d.

At 410, the method performs an action to construct clusters. To perform this action, let h be a lower boundary edge of a trapezoid A considering by the algorithm at the current moment. The method accounts that each detected trapezoid has a pointer to the head of the cluster containing it. Hence, it can associate with each detected via, from the left (SW corner) and the right (SE corner) endpoint of h, the sequential number of cluster containing it. The method chooses the minimum from these numbers and attach the number to the cluster A. Then, it places the cluster A into the head of the list (indeed the root of a tree) with pointers to the heads $B_i$ of lists (subclusters), containing the detected clusters, and vectors (SW(A), SW($B_i$)). Also, the head of the new list will contain the type of the cluster—the number of vias in the cluster.

The method represents a cluster as a tree. Each node u of the tree corresponds to a trapezoid A(u) of the cluster. Due to the process of forming a cluster, a son of a node of the tree corresponds to the head (the root of a subtree) of a subcluster formed on previous steps, and each node contains the pointer to the head of the cluster. The method codes each node u of the tree by the following way:

full code $(1, (p_1, (x_1, y_1), t_1), \ldots, (p_1, (x_1, y_1), t_1))$ and
short code $(1, (p_1, f(x_1, y_1)), \ldots, (p_1, f(x_1, y_1)))$ where 1 is the number of sons of the node v, $p_i$ is a pointer to the head of the cluster containing the i-th detected trapezoid, $(x_i, y_i)$ is the vector SWA(u)-SWA(son u) following in the increasing order of the numbers corresponding to detected clusters, $t_i$ is a type of trapezoid (coordinates of its vertices), and function f is specially chosen for enhancing speed of recognizing clusters.

At 412, the method perform an action to recognize clusters. Since each cluster is represented by a tree, then starting from the root (head of the cluster) the method can compare, first, type of the cluster with type of a cluster from dictionary, then compare short codes of all nodes of the tree with corresponding ones from dictionary. If all short codes coincide with corresponding ones from the dictionary, then the process checks if the full codes of the cluster coincide with corresponding ones from the dictionary.

In an embodiment of the present approach, the method represents a cluster as a list of trapezoids. Global coordinates of trapezoids are recalculated by shifting X=0 Y=0 point to lower left corner of cluster boundary. Therefore for each recognized cluster the method keeps such a list of trapezoids and placement coordinates. Library of clusters contains a list of unique recognized clusters which themselves have a list of placements found in the original layout. For each library cluster the method calculates a vector S as follows:

$$S = \Sigma Vi,$$

where Vi are vectors from lower left corner of cluster to a center boundary rectangle of i-th trapezoid.

The process then recalculates vector S by rotating and mirroring the cluster. Therefore, the method stores for each library clusters vectors S1-S8. As such, each vector S represents one of cases of rotating/mirroring of the cluster. As the new cluster is recognized, the method finds if this cluster is already present in the library. If the cluster is already in the library the method will put just information about placement coordinates and rotation/mirroring. If it is not in the library the method will add a new library cluster.

In an alternate embodiments, the present approach can be applied to any area where layout data hierarchy creation is required.

System Architecture Overview

Figure 5:
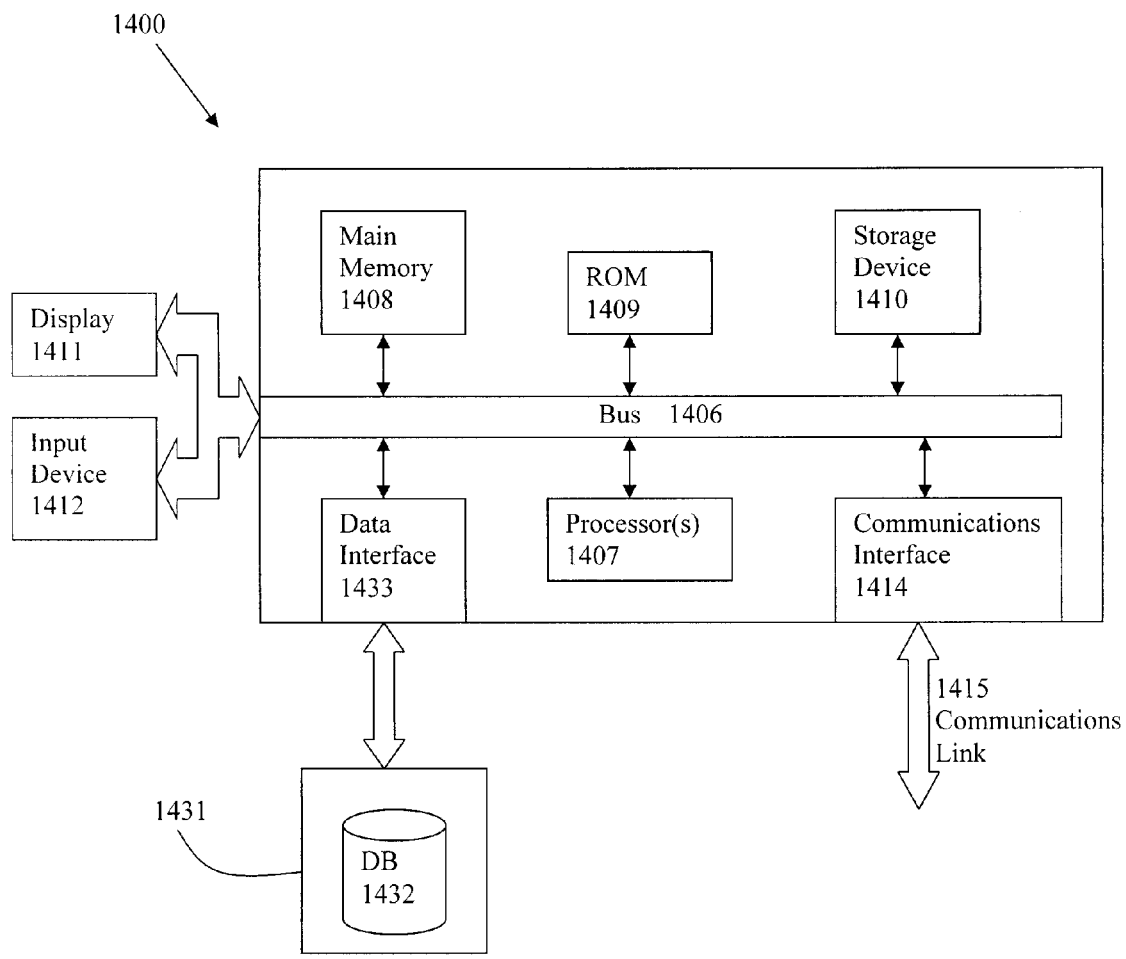
FIG. 5 illustrates an example computing architecture with which embodiments of the invention may be practiced.

FIG. 5 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media, volatile media, and transmission media. Non-volatile media includes, for example, optical or magnetic disks, such as disk drive 1410. Volatile media includes dynamic memory, such as system memory 1408. Transmission media includes coaxial cables, copper wire, and fiber optics, including wires that comprise bus 1406. Transmission media can also take the form of acoustic or light waves, such as those generated during radio wave and infrared data communications.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer-implemented method of performing an electronic design automation operation upon polygons in an integrated circuit design, comprising:
   receiving an integrated circuit design, the integrated circuit design comprising a plurality of polygons;
   clustering, by using a processor, the plurality of polygons to form clusters, in which the act of clustering is performed by:
      determining vertices of the plurality of polygons as corresponding vertices of a plurality of trapezoids;
      sorting the corresponding vertices of the plurality of trapezoids;
      storing the corresponding vertices of the plurality of trapezoids in a file; and
      constructing the clusters based at least in part upon the corresponding vertices of the plurality of trapezoids, wherein at least one of the clusters is represented as a tree structure such that a node of the tree structure corresponds to at least one of the plurality of trapezoids;
   identifying a pattern of polygons that is shared among the clusters having the same pattern of polygons;
   performing the electronic design automation operation upon the pattern of polygons to generate an operation result;
   replicating the operation result on the clusters having the same pattern of polygons without performing the electronic design automation operation upon the clusters; and
   storing the operation result in a volatile or non-volatile computer readable medium or display the operation result on a display device.

2. The method of claim 1 in which the vertices from the file are checked to detect all trapezoids which satisfy a clustering condition.

3. The method of claim 1 in which an association is made between a detected trapezoid to a sequential number of clusters containing the detected trapezoid.

4. The method of claim 3 in which a minimum is chosen and which attaches a number to the trapezoid.

5. The method of claim 4 in which a list is created having the detected trapezoid placed into a head of the list with pointers to heads of lists corresponding to one or more sub-clusters containing the detected trapezoids.

6. The method of claim 1 in which a cluster is represented as a tree.

7. The method of claim 6 in which each node of the tree corresponds to a trapezoid of the cluster.

8. The method of claim 1 in which a cluster is stopped in its formation when a difference between a first y-coordinate of currently considered vertex and a second y-coordinate of the upper edge of the trapezoid which currently is the head of a cluster is more than a threshold number.

9. The method of claim 1 in which the act of clustering is performing using a plane sweep method.

10. The method of claim 9 in which the plane-sweep method searches in only a horizontal or vertical direction.

11. The method of claim 10 in which both the horizontal and vertical directions are searched simultaneously.

12. The method of claim 1 in which the act of identifying the pattern of polygons that is shared among multiple clusters having the same pattern of polygons is performed by determining whether there exists an orthogonal transformation that establishes one-to-one correspondence between polygons from the multiple clusters.

13. A computer-implemented method of forming clusters of polygons to perform electronic design automation operations for an integrated circuit design, comprising:
  receiving an integrated circuit design having a plurality of polygons;
  using a processor for:
    determining vertices of the plurality of polygons as corresponding vertices of a plurality of trapezoids;
    sorting the corresponding vertices of the plurality of trapezoids;
    constructing the clusters based at least in part upon the corresponding vertices of the plurality of trapezoids, wherein at least one of the clusters is represented as a tree structure such that a node of the tree structure corresponds to at least one of the plurality of trapezoids; and
    storing the clusters on a volatile or non-volatile computer readable medium or displaying the clusters on a display device.

14. The method of claim 13 in which the vertices from the file are checked to detect all trapezoids which satisfy a clustering condition.

15. The method of claim 13 in which an association is made between a detected trapezoid to a sequential number of clusters containing the detected trapezoid.

16. The method of claim 15 in which a minimum is chosen, wherein the minimum is used to attach a number to the trapezoid.

17. The method of claim 16 in which a list is created having the detected trapezoid placed into a head of the list with pointers to heads of lists corresponding to one or more subclusters containing the detected trapezoids.

18. The method of claim 13 in which a cluster is represented as a tree.

19. The method of claim 18 in which each node of the tree corresponds to a trapezoid of the cluster.

20. The method of claim 13 in which constructing the clusters further comprises stopping a formation of a cluster when a difference between a y-coordinate of currently considered vertex and a y-coordinate of the upper edge of the trapezoid is more than a threshold number.

21. The method of claim 13 in which a plane sweep method is employed.

22. The method of claim 21 in which the plane-sweep method searches in only a horizontal or vertical direction.

23. The method of claim 22 in which both the horizontal and vertical directions are searched simultaneously.

24. A computer program product comprising a volatile or non-volatile computer usable medium having executable code to execute a process using a processor for forming clusters of polygons to perform electronic design automation operations for an integrated circuit design, the process comprising:
  receiving an integrated circuit design having a plurality of polygons;
  determining vertices of the polygons as corresponding vertices of trapezoids;
  sorting the corresponding vertices of the trapezoids;
  constructing the clusters based at least in part upon the corresponding vertices of the plurality of trapezoids, wherein at least one of the clusters is represented as a tree structure such that a node of the tree structure corresponds to at least one of the plurality of trapezoids; and
  storing the clusters or displaying the clusters on a display device.

25. The product of claim 24, further comprising checking the corresponding vertices to detect one or more trapezoids which satisfy a clustering condition.

26. The product of claim 24, further comprising making an association between a detected trapezoid to a sequential number of clusters containing the detected trapezoid.

27. A system for forming clusters of polygons to perform electronic design automation operations for an integrated circuit design, comprising:
  interface for receiving an integrated circuit design having a plurality of polygons;
  a processor for:
    determining vertices of the polygons as corresponding vertices of trapezoids;
    sorting the corresponding vertices of the trapezoids;
    constructing the clusters based at least in part upon the corresponding vertices of the plurality of trapezoids, wherein at least one of the clusters is represented as a tree structure such that a node of the tree structure corresponds to at least one of the plurality of trapezoids; and
  a volatile or non-volatile computer readable medium for storing the clusters or a display device for displaying the clusters.

28. The system of claim 27 in which the vertices are checked to detect one or more trapezoids which satisfy a clustering condition.

29. The system of claim 27 in which an association is made between a detected trapezoid to a sequential number of clusters containing the detected trapezoid.

30. A computer program product comprising a volatile or non-volatile computer usable medium having executable code to execute a process using a processor for performing an electronic design automation operation upon polygons in an integrated circuit design, the process comprising:
  receiving an integrated circuit design, the integrated circuit design comprising a plurality of polygons;
  clustering the plurality of polygons to form clusters, in which the act of clustering is performed by:
    determining vertices of the plurality of polygons as corresponding vertices of a plurality of trapezoids;
    sorting the corresponding vertices of the plurality of corresponding trapezoids;
    storing the corresponding vertices of the plurality of trapezoids in a file; and
    constructing the clusters based at least in part upon the corresponding vertices of the plurality of trapezoids, wherein at least one of the clusters is represented as a tree structure such that a node of the tree structure corresponds to at least one of the plurality of trapezoids;
  identifying a pattern of polygons that is shared among the clusters having the same pattern of polygons;

performing the electronic design automation operation upon the pattern of polygons to generate an operation result; and replicating the operation result on the clusters having the same pattern of polygons without performing the electronic design automation operation upon the clusters; and storing the operation result or display the operation result on a display device.

31. The product of claim 30 in which the vertices from the file are checked to detect all trapezoids which satisfy a clustering condition.

32. The product of claim 30, further comprising making an association between a detected trapezoid to a sequential number of clusters containing the detected trapezoid, in which a minimum is chosen, wherein the minimum is used to attach a number to the trapezoid, in which a list is created having the detected trapezoid placed into a head of the list with pointers to heads of lists corresponding to one or more subclusters containing the detected trapezoids.

33. A system comprising:
an interface for receiving an integrated circuit design, the integrated circuit design comprising a plurality of polygons;
a processor programmed for:
clustering the plurality of polygons to form clusters, in which the processor is configured for:
determining vertices of the plurality of polygons as corresponding vertices of a plurality of trapezoids;
sorting the corresponding vertices of the plurality of trapezoids;
storing the corresponding vertices of the trapezoids in a file; and
constructing the clusters based at least in part upon the corresponding vertices of the plurality of trapezoids, wherein at least one of the clusters is represented as a tree structure such that a node of the tree structure corresponds to at least one of the plurality of trapezoids;
identifying a pattern of polygons that is shared among clusters having the same pattern of polygons;
performing the electronic design automation operation upon the pattern of polygons to generate an operation result; and
replicating the operation result on the clusters having the same pattern of polygons without performing the electronic design automation operation upon the clusters; and
a volatile or non-volatile computer readable medium for storing the operation result or a display device for display the operation result.

34. The system of claim 33 in which the vertices from the file are checked to detect all trapezoids which satisfy a clustering condition.

35. The system of claim 33 in which an association is made between a detected trapezoid to a sequential number of clusters containing the detected trapezoid, in which a minimum is chosen, wherein the minimum is used to attach a number to the trapezoid, in which a list is created having the detected trapezoid placed into a head of the list with pointers to heads of lists corresponding to one or more subclusters containing the detected trapezoids.

* * * * *